United States Patent
Hwang et al.

(10) Patent No.: US 8,487,736 B2
(45) Date of Patent: Jul. 16, 2013

(54) SEMICONDUCTOR RESISTANCE ELEMENT, SEMICONDUCTOR MODULE INCLUDING THE SAME, AND PROCESSOR-BASED SYSTEM INCLUDING THE SEMICONDUCTOR MODULE

(71) Applicants: Hyung-Mo Hwang, Cheonan-si (KR); Hyun-Seok Choi, Asan-si (KR); Young-Chul Park, Cheongju-si (KR)

(72) Inventors: Hyung-Mo Hwang, Cheonan-si (KR); Hyun-Seok Choi, Asan-si (KR); Young-Chul Park, Cheongju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/690,272

(22) Filed: Nov. 30, 2012

(65) Prior Publication Data

US 2013/0087922 A1    Apr. 11, 2013

Related U.S. Application Data

(62) Division of application No. 12/957,902, filed on Dec. 1, 2010, now Pat. No. 8,350,664.

(30) Foreign Application Priority Data

Feb. 26, 2010 (KR) .................. 10-2010-0018084

(51) Int. Cl.
*H01C 13/00* (2006.01)

(52) U.S. Cl.
USPC ............ 338/334; 338/327; 338/309; 338/307

(58) Field of Classification Search
USPC .......................................... 338/334, 327, 320
See application file for complete search history.

(56) References Cited

U.S. PATENT DOCUMENTS

| | | | | |
|---|---|---|---|---|
| 5,170,146 | A * | 12/1992 | Gardner et al. | 338/313 |
| 5,285,184 | A * | 2/1994 | Hatta et al. | 338/313 |
| 5,546,269 | A * | 8/1996 | Robinson et al. | 361/660 |
| 7,277,006 | B2 * | 10/2007 | Yokoo et al. | 338/309 |
| 7,667,569 | B2 * | 2/2010 | Iseki et al. | 338/309 |
| 7,907,046 | B2 * | 3/2011 | Tsukada | 338/309 |
| 8,179,226 | B2 * | 5/2012 | Ryu et al. | 338/309 |
| 2010/0225439 | A1 * | 9/2010 | Han et al. | 338/309 |

FOREIGN PATENT DOCUMENTS

| | | |
|---|---|---|
| JP | 7-320915 | 12/1995 |
| JP | 2007-165516 | 6/2007 |
| KR | 100168965 | 10/1998 |

* cited by examiner

*Primary Examiner* — Kyung Lee
(74) *Attorney, Agent, or Firm* — Harness, Dickey & Pierce

(57) ABSTRACT

Provided may be a semiconductor resistance element including resistance patterns disposed on an insulating substrate. The substrate may have first and second planar surfaces disposed in a first direction, third and fourth planar surfaces at least between the first and second planar surfaces in a second direction and fifth and sixth planar surfaces at least between the first and second planar surfaces in a third direction. The semiconductor resistance element may include a first resistance pattern configured to cover a selected one of the first and second planar surfaces and a second resistance pattern on at least one of the third through sixth planar surfaces.

15 Claims, 12 Drawing Sheets

SEMICONDUCTOR RESISTANCE ELEMENT, SEMICONDUCTOR MODULE INCLUDING THE SAME, AND PROCESSOR-BASED SYSTEM INCLUDING THE SEMICONDUCTOR MODULE

CROSS-REFERENCE TO RELATED APPLICATION

This application is a divisional under 35 U.S.C. §120 of U.S. application Ser. No. 12/957,902, filed on Dec. 1, 2010, which claims priority under 35 U.S.C. §119 to Korean Patent Application No. 10-2010-0018084 filed on Feb. 26, 2010 in the Korean Intellectual Property Office (KIPO), the entire disclosure of each of which is hereby incorporated by reference in its entirety.

BACKGROUND

1. Field

Example embodiments of the inventive concepts relate to a semiconductor resistance element, a semiconductor module including the semiconductor resistance element, and a processor-based system including the semiconductor module.

2. Description of Related Art

Semiconductor modules have been fabricated to be highly functional and highly integrated. To embody the higher functionality of the semiconductor modules, semiconductor devices with different functions may be disposed on printed circuit boards (PCBs). To embody the higher integration density of the semiconductor modules, semiconductor devices and/or semiconductor resistance elements may be integrated on small areas of the PCBs. The semiconductor devices may be sequentially stacked in semiconductor package structures.

Further, each of the semiconductor resistance elements may include resistance patterns disposed at the same level of the stack on an insulating substrate. However, to meet the requirement for the higher integration of the semiconductor module, there may be a technical limit in disposing the resistance patterns at the same level of the stack on the insulating substrate. This is because the resistance patterns are more likely to be electrically connected to one another on the insulating substrate with the continuously higher integration of the semiconductor modules.

The semiconductor module may have poorer or degraded electrical properties due to the semiconductor resistance elements. The semiconductor module may be included in a processor-based system. The processor-based system may have poorer or degraded electrical properties due to the semiconductor resistance elements included in the semiconductor module.

SUMMARY

Embodiments of the inventive concepts provide a semiconductor resistance element including resistance patterns disposed at different levels along a surface of an insulating substrate.

Also, embodiments of the inventive concepts provide a semiconductor module including semiconductor resistance elements in which resistance patterns are disposed on an insulating substrate with a process margin, and a processor-based system including the semiconductor module.

In accordance with aspects of the inventive concepts, a semiconductor resistance element may include a substrate. The substrate may be configured to form a solid body in a 3-dimensional space. The substrate may have first and second planar surfaces disposed in an first direction, third and fourth planar surfaces disposed at least between the first and second planar surfaces in a second direction, and fifth and sixth planar surfaces disposed between the first and second planar surfaces in a third direction. At least a first resistance pattern may be configured to cover one selected from the first and second planar surfaces. At least a second resistance pattern may be disposed on at least one of the third through sixth planar surfaces.

The semiconductor resistance element may further include first through fourth electrodes. A first electrode may be electrically connected to a first end of the first resistance pattern and a second electrode may be electrically connected to a second end of the first resistance pattern. A third electrode may be electrically connected to a first end of the second resistance pattern and a fourth electrode may be electrically connected to a second end of the second resistance pattern. The first and second electrodes may extend across the third and fourth planar surfaces respectively and extend to the first and second planar surfaces. The first resistance pattern may be disposed on the selected one of the first and second planar surfaces.

The third and fourth electrodes may extend across at least one of the fifth and sixth planar surfaces and extend to at least one of the first and second planar surfaces. The second resistance pattern may be disposed on the at least one of the fifth and sixth planar surfaces.

The second resistance pattern may be disposed parallel to or at an angle to the first resistance pattern.

In accordance with another aspect of the inventive concepts, a semiconductor module may include a module substrate and at least one semiconductor resistance element. The first semiconductor resistance element may be disposed on the module substrate and electrically connected to the module substrate. The semiconductor resistance element may include a substrate. The substrate may be defined by first through sixth planar surfaces. The substrate may have the first and second planar surfaces disposed at different levels. The third and fourth planar surfaces may be disposed at least between the first and second planar surfaces in a first direction, and the fifth and sixth planar surfaces may be disposed at least between the first and second planar surfaces in a second direction. The first resistance pattern may be configured to partially cover one selected from the first and second planar surfaces. A second resistance pattern may be disposed on at least one of the third through sixth planar surfaces.

The semiconductor module may further include first through fourth electrodes. A first electrode may be electrically connected to a first end of the first resistance pattern and a second electrode may be electrically connected to a second end of the first resistance pattern. A third electrode may be electrically connected to a first end of the second resistance pattern and a fourth electrode may be electrically connected to a second end of the second resistance pattern. The second resistance pattern may be disposed parallel to or at an angle to the first resistance pattern.

The first and second electrodes may extend across the third and fourth planar surfaces respectively and extend to the first and second planar surfaces. The first resistance pattern is disposed on the selected one of the first and second planar surfaces.

The third and fourth electrodes may extend across at least one of the fifth and sixth planar surfaces extend to at least one of the first and second planar surfaces. The second resistance pattern may be disposed on the at least one of the fifth and sixth planar surfaces.

The first and second electrodes may extend across the third and fourth planar surfaces respectively and extend to the first and second planar surfaces. The first resistance pattern may be disposed on the selected one of the first and second planar surfaces.

The third and fourth electrodes may be disposed in at least one pair at each of different levels on at least one of the fifth and sixth planar surfaces and extend to at least one of the first and second planar surfaces. The second resistance pattern may be disposed on the at least one of the fifth and sixth planar surfaces.

The first and second electrodes may extend across the third and fourth planar surfaces respectively and extend to the first and second planar surfaces. The first resistance pattern may fill a first groove disposed in the selected one of the first and second planar surfaces and protrude from the first groove.

The third and fourth electrodes may extend across at least one of the fifth and sixth planar surfaces in a pair and extend to at least one of the first and second planar surfaces. The second resistance pattern may fill a second groove disposed in the at least one of the fifth and sixth planar surfaces and protrude from the second groove.

The first and second electrodes may extend across the third and fourth planar surfaces respectively and extend to the first and second planar surfaces. The first resistance pattern may fill a first groove disposed in the selected one of the first and second planar surfaces and protrude from the first groove.

The third and fourth electrodes may be disposed in at least one pair at each of different levels on at least one of the fifth and sixth planar surfaces and extend to at least one of the first and second planar surfaces. The second resistance pattern may fill a second groove disposed in the at least one of the fifth and sixth planar surfaces and protrude from the second groove.

The first and second electrodes may extend across the third and fourth planar surfaces respectively and extend to the first and second planar surfaces. The first resistance pattern may be disposed on the selected one of the first and second planar surfaces.

The third and fourth electrodes may extend across the fifth and sixth planar surfaces respectively and extend to at least one of the first and second planar surfaces. The at least one second resistance pattern may contact the third and fourth electrodes through the substrate between the fifth and sixth planar surfaces.

The first and second electrodes may extend across the third and fourth planar surfaces respectively and extend to the first and second planar surfaces. The first resistance pattern may be disposed on the selected one of the first and second planar surfaces.

Each of the third and fourth electrodes may be disposed at least one at different levels on each of the fifth and sixth planar surfaces and extend to at least one of the first and second planar surfaces. The second resistance pattern may contact the third and fourth electrodes through the substrate between the fifth and sixth planar surfaces.

The semiconductor module may further include a third resistance pattern and fifth and sixth electrodes. The third resistance pattern may be disposed adjacent to the second resistance pattern. A fifth electrode may be electrically connected to a first end of the third resistance pattern and a sixth electrode may be electrically connected to a second end of the third resistance pattern. The first and second electrodes may extend across the third and fourth planar surfaces respectively and extend to the first and second planar surfaces. The first resistance pattern may be disposed on the selected one of the first and second planar surfaces.

The third and fourth electrodes may cover a first region of at least one of the fifth and sixth planar surfaces in a first pair and extend to at least one of the first and second planar surfaces. The second resistance pattern may be disposed on the first region of the at least one of the fifth and sixth planar surfaces. The fifth and sixth electrodes may cover a second region of the at least one of the fifth and sixth planar surfaces in a second pair and extend to the at least one of the first and second planar surfaces. The third resistance pattern may be disposed on a third region of the at least one of the fifth and sixth planar surfaces.

A distance between the first and second electrodes may be equal to or different from a distance between the third and fourth electrodes. A distance between the third and fourth electrodes may be different from a distance between the fifth and sixth electrodes. The second resistance pattern may be disposed parallel to or at an angle to the third resistance pattern.

In accordance with still other aspects of the inventive concepts, a processor-based system may include a system board. The system board may have at least one bus line. A first module unit may be disposed on the system board and electrically connected to the at least one bus line. A second module unit may be disposed on the system board and electrically connected to the at least one bus line. At least one of the first and second module units may include a semiconductor module. The semiconductor module may include a first semiconductor resistance element. The first semiconductor resistance element may include a substrate. The substrate may be configured to form a solid body. The substrate may have first and second planar surfaces disposed in a first direction, third and fourth planar surfaces disposed between the first and second planar surfaces in a second direction, and fifth and sixth planar surfaces disposed between the first and second planar surfaces in a third direction. A first resistance pattern may be configured to cover one selected from the first and second planar surfaces. A second resistance pattern may be disposed on at least one of the third through sixth planar surfaces.

The first module unit may include a central processing unit (CPU), a floppy disk drive (FDD), and a compact disk read-only-memory (ROM) drive. The second module unit may include a first input/output (I/O) device, a second input/output (I/O) device, a ROM, and a random access memory (RAM).

The processor-based system may further include first through fourth electrodes. The first electrode may be electrically connected to a first end of the first resistance pattern and the second electrode may be electrically connected to a second end of the first resistance pattern. The third electrode may be electrically connected to a first end of the second resistance pattern and the fourth electrode may be electrically connected to a second end of the second resistance pattern. The at least one second resistance pattern may be disposed parallel to or at an angle to the at least one first resistance pattern.

The first and second electrodes may extend across the third and fourth planar surfaces respectively and extend to the first and second planar surfaces. The first resistance pattern may be disposed on the selected one of the first and second planar surfaces.

The third and fourth electrodes may extend across at least one of the fifth and sixth planar surfaces in a pair and extend to at least one of the first and second planar surfaces. The second resistance pattern may be disposed on the at least one of the fifth and sixth planar surfaces.

BRIEF DESCRIPTION OF THE DRAWINGS

The foregoing and other features and advantages of the embodiments of the inventive concepts will be apparent from the more particular description of the preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
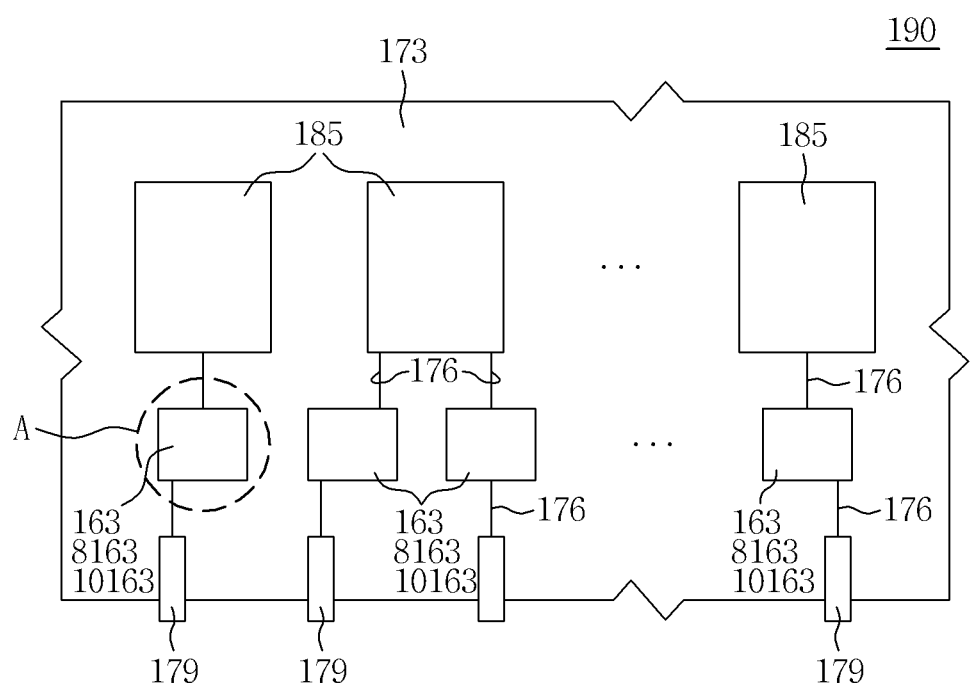
FIG. 1 is a plan view of a semiconductor module according to embodiments of the inventive concepts.

Various embodiments will now be described more fully with reference to the accompanying drawings in which some embodiments are shown. These embodiments of the inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a semiconductor module according to embodiments of the inventive concepts will be described with reference to FIGS. 1 and 2.

FIG. 1 is a plan view of a semiconductor module according to embodiments of the inventive concepts.

Referring to FIG. 1, a semiconductor module 190 may include a module substrate 173. The module substrate 173 may be a printed circuit board (PCB). The PCB may be bendable, rigid, flexible or inflexible. The module substrate 173 may include internal circuits (not shown), a plurality of electric pads grouping region A and connectors 179. The internal circuits may be electrically connected to the plurality of electric pads grouping region A and the connectors 179. Semiconductor package structures 185 and semiconductor resistance elements 163, 8163, and 10163 may be placed, fixed or disposed on the module substrate 173.

Each of the semiconductor package structures 185 may have at least one semiconductor device (not shown). The semiconductor package structures 185 may or may not have the same function. The semiconductor resistance elements 163, 8163, or 10163 may be placed, fixed or disposed adjacent to the semiconductor package structures 185 and be electrically connected to the semiconductor package structures 185. The semiconductor resistance elements 163, 8163, or 10163 and the semiconductor package structures 185 may be electrically connected to the connectors 179 of the module substrate 173 through the internal circuits of the module substrate 173 and/or electric interconnections 176.

Figure 2:
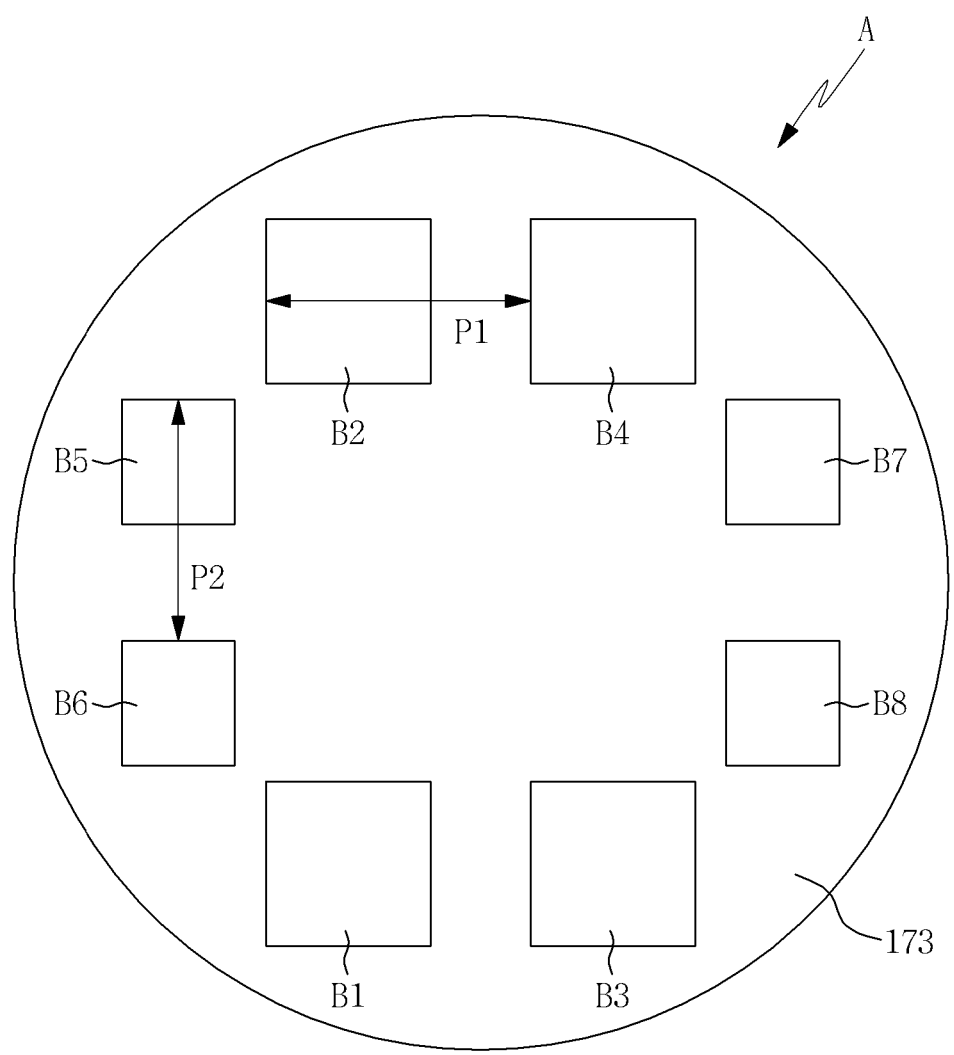
FIG. 2 is an enlarged view of a region 'A' of FIG. 1, illustrating electric pads disposed on the semiconductor module.

FIG. 2 is an enlarged view of a region A of FIG. 1, illustrating at least one of the plurality of electric pads fixed, placed or disposed on the module substrate 173.

Referring to FIG. 2, the semiconductor module 190 according to embodiments of the inventive concepts may include at least electric pads B1, B2, B3, B4, B5, B6, B7, and B8 fixed, placed or disposed on the module substrate 173, which is a PCB. The electric pads B1, B2, B3, B4, B5, B6, B7, and B8 may be fixed, placed or disposed in a corresponding one of the semiconductor resistance elements 163, 8163, and 10163 of FIG. 1. A portion of at least one of the electrical pads B1, B2, B3, and B4 may have a first pitch P1. The first pitch P1 may be in a first direction, which is a direction that the connectors 179 of FIG. 1 are arranged.

The other electrical pads B5, B6, B7, and B8 may have a second pitch P2 in a second or perpendicular direction to the first direction in which the connectors 179 are arranged. The second pitch P2 may be equal to or different from the first pitch P1. If the first pitch P1 is equal to the second pitch P2, distances between the electrical pads B1, B2, B3, and B4 may be equal to or different from the distance between the electrical pads B5, B6, B7, and B8.

If the first pitch B1 is different from the second pitch P2, the distances between the electrical pads B1, B2, B3, and B4 may be equal to or different from the distance between the electrical pads B5, B6, B7, and B8.

FIGS. 3 through 7 are schematic views illustrating a method of forming a semiconductor resistance element of FIG. 1, according to embodiments of the inventive concepts.

Figure 3:
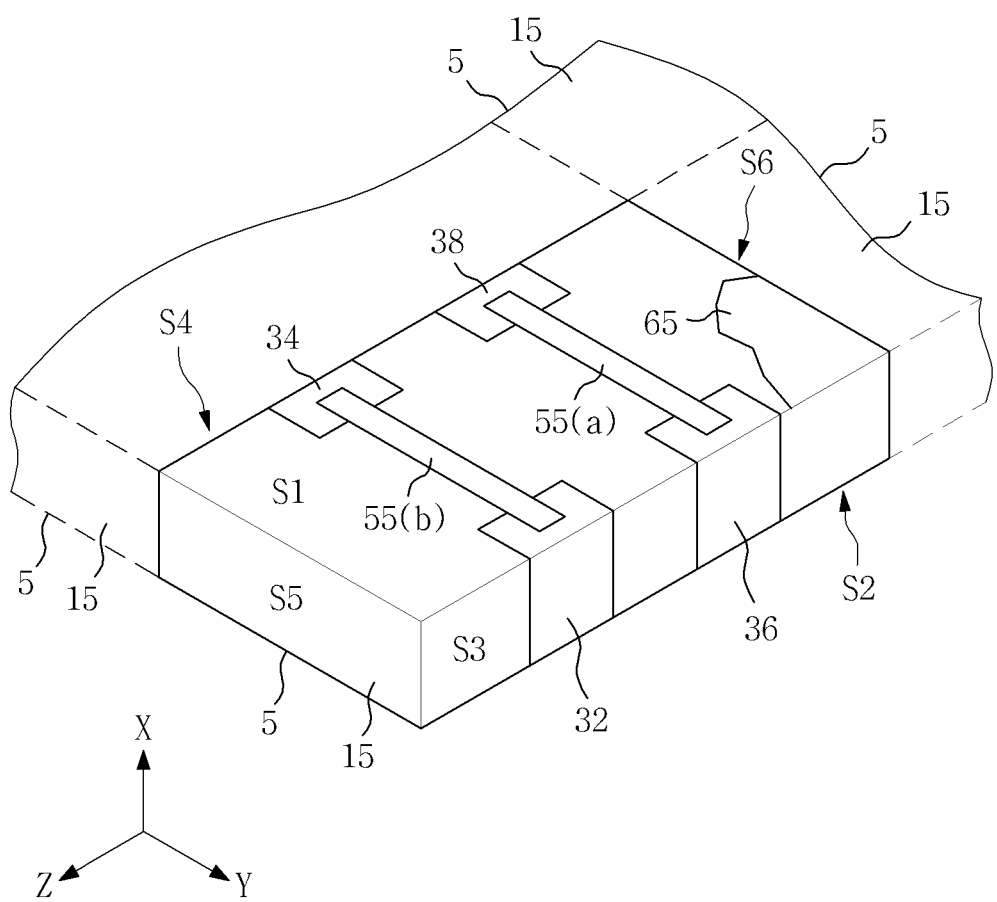
FIGS. 3 through 7 are schematic views illustrating a method of forming a semiconductor resistance element of FIG. 1, according to embodiments of the inventive concepts.

FIG. 3 is a perspective view illustrating an initial step in a method of forming a semiconductor resistance element according to embodiments of the inventive concepts.

Referring to FIG. 3, a plate 5 according to embodiments of the inventive concepts may be prepared. The plate 5 may include an insulating material. The plate 5 may include trenches (not shown) and holes (not shown). The trenches may surround a desired, required or predetermined region of the plate 5 to define an insulating substrate 15. The holes may be disposed along the trenches, may be spaced apart from one another, and may penetrate the plate 5.

The insulating substrate 15 may be formed on the plate 5. The insulating substrate 15 may be defined as a solid body surrounded by the first through sixth planar surfaces S1, S2, S3, S4, S5, and S6 in a 3-dimensional space. The first and second planar surfaces S1 and S2 may be disposed at different levels in an X direction or a first direction of the 3-dimensional space. The third and fourth planar surfaces S3 and S4 may be disposed at least between the first and second planar surfaces S1 and S2 in a Y direction or a second direction of the 3-dimensional space.

The third and fourth planar surfaces S3 and S4 may be disposed at the same level as each other, in the Y direction or second direction of the 3-dimensional space. Alternatively, the third and fourth planar surfaces S3 and S4 may be disposed at different levels in the Y direction or the second direction of the 3-dimensional space.

The fifth and sixth planar surfaces S5 and S6 may be disposed at least between the first and second planar surfaces S1 and S2 in a Z direction or third direction of the 3-dimensional space. The fifth and sixth planar surfaces S5 and S6 may be disposed at the same level as each other, in the Z direction or third direction of the 3-dimensional space.

The fifth and sixth planar surfaces S5 and S6 may be disposed at different levels in the Z or third direction of the 3-dimensional space. In this example embodiment, the first and second planar surfaces S1 and S2 may be exposed through the plate 5 before the insulating substrate 15 is separated from the plate 5. The third planar surface S3 and/or the fourth planar surface S4 may not be exposed through the plate 5 before the insulating substrate 15 is separated from the plate 5. In addition, the fifth planar surface S5 and/or the sixth planar surface S6 may not be exposed through the plate 5 before the insulating substrate 15 is separated from the plate 5.

The trenches may be formed between the planar surfaces S1 and/or between second planar surfaces S2 of adjoining insulating substrates 15 in the X, Y and Z or the first, second and third directions of the 3-dimensional space. The holes may be formed in the third and fourth planar surfaces S3 and S4 between the first and second planar surfaces S1 and S2 of the adjoining insulating substrates 15 in the X, Y and Z or the first, second and third directions of the 3-dimensional space. First and second electrodes 32 and 34 may be formed on selected regions of the first through fourth planar surfaces S1, S2, S3, and S4 in the X and Y or first and second directions of the 3-dimensional space.

The first and second electrodes 32 and 34 may extend through the third and fourth planar surfaces S3 and S4 respectively to extend to the first and second planar surfaces S1 and S2. The first and second electrodes 32 and 34 may be formed to partially cover the first and second planar surfaces S1 and S2 and face each other in the first and second planar surfaces S1 and S2. The first and second electrodes 32 and 34 may conformally cover sidewalls of the holes or sufficiently fill the holes to partially expose the trenches. Third and fourth electrodes 36 and 38 may be formed on regions of the first through fourth planar surfaces S1, S2, S3, and S4 in the X and Y or the first and second directions of the 3-dimensional space.

The third and fourth electrodes 36 and 38 may be formed to partially cover the first and second planar surfaces S1 and S2 and face each other in the first and second planar surfaces S1 and S2. The third and fourth electrodes 36 and 38 may extend across the third and fourth planar surfaces S3 and S4 respectively to extend to the first and second planar surfaces S1 and S2. The third and fourth electrodes 36 and 38 may conformally cover the sidewalls of the holes and sufficiently fill the holes to partially expose the trenches. The first through fourth electrodes 32, 34, 36, and 38 may be formed to the same pitch or different pitches on the first planar surface S1.

The first through fourth electrodes 32, 34, 36, and 38 may include a conductive material. The first through fourth electrodes 32, 34, 36, and 38 may include nickel (Ni), nickel chromium (NiCr), and tin (Sn). Alternatively, the first through fourth electrodes 32, 34, 36, and 38 may include Ni, silver (Ag), and Sn. The first through fourth electrodes 32, 34, 36, and 38 may be formed by sputter and electroplating processes or printing and electroplating processes.

In other example embodiments, only the first and second electrodes 32 and 34 or only the third and fourth electrodes 36 and 38 may be formed on the first through fourth planar surfaces S1 to S4. Other electrodes than the first through fourth electrodes 32, 34, 36, and 38 may be formed in electrode pairs.

First resistance patterns 55(*a*) and 55(*b*) may be formed on the first planar surface S1 in the X and Y or first and second directions of the 3-dimensional space. The first resistance pattern 55(*b*) may be formed at least between the first and second electrodes 32 and 34 and the first resistance pattern 55(*a*) may be formed between the third and fourth electrodes 36 and 38.

The first resistance pattern 55(*b*) may be electrically connected to the first and second electrodes 32 and 34 and the first resistance pattern 55(*a*) may be electrically connected to the third and fourth electrodes 36 and 38. The first resistance patterns 55 may include an insulating material. The first resistance patterns 55(*a*) and 55(*b*) may include a metal oxide, for example, ruthenium oxide ($RuO_2$). The first resistance patterns 55(*a*) and 55(*b*) may be formed on the first planar surface S1. The first resistance patterns 55(*a*) and 55(*b*) may be electrically connected to the other electrodes other than the first through fourth electrodes 32, 34, 36, and 38.

A first protection layer 65 may be formed on the first planar surface S1 to cover the first through fourth electrodes 32, 34, 36, and 38 and the first resistance patterns 55. The first protection layer 65 may include an insulating material. In another example embodiment, the first protection layer 65 may be formed on the second planar surface S2 instead of the first planar surface S1 along with the first resistance patterns 55(*a*) and 55(*b*).

Figure 4:
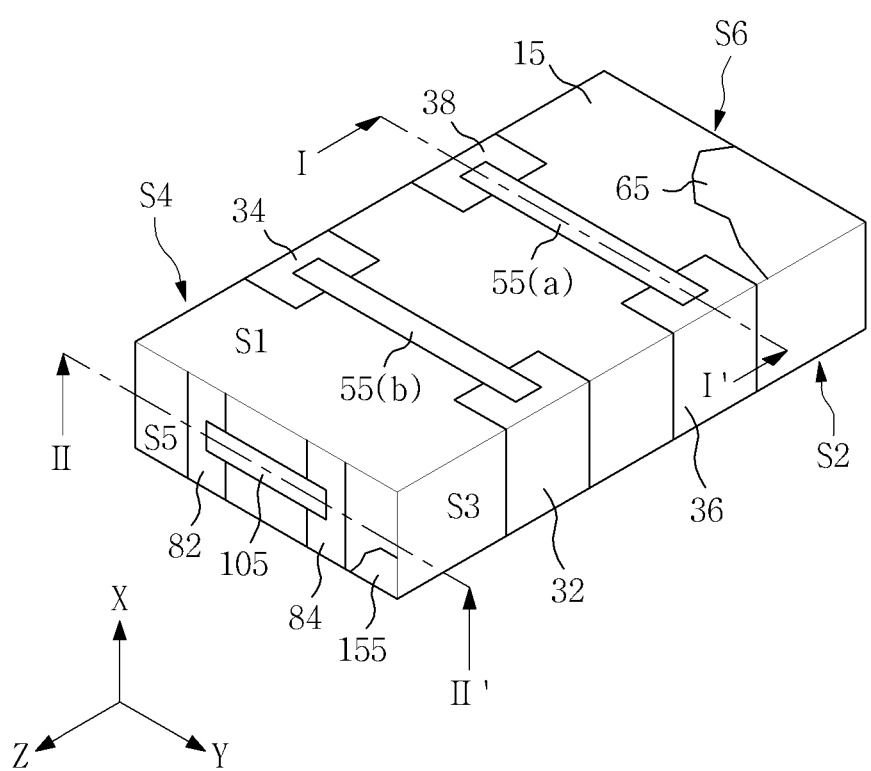

FIG. 4 is a perspective view illustrating a final step in a method of forming a semiconductor resistance element according to embodiments of the inventive concepts.

Referring to FIG. 4, according to embodiments of the inventive concepts, the insulating substrate 15 may be separated from the plate 5 of FIG. 3. The insulating substrate 15 may be separated along the trenches disposed in the plate 5. Fifth through eighth electrodes 82, 84, 86, and 88 (the seventh and eight electrodes 86 and 88 are not shown) may be formed on the second, fifth, and sixth planar surfaces S2, S5, and S6 in X and Z or first and third directions of the 3-dimensional space. Although not shown in FIG. 4, the seventh and eighth electrodes 86 and 88 may be formed on the sixth planar surface S6 to have the same dimensions or shape as the fifth and sixth electrodes 82 and 84.

The fifth and sixth electrodes 82 and 84 may extend through the fifth planar surface S5 in a pair to extend to the second planar surface S2. The fifth and sixth electrodes 82 and 84 may be formed on the second planar surface S2 to face each other. The fifth and sixth electrodes 82 and 84 may be formed in at least two pairs on the second and fifth planar surfaces S2 and S5. The seventh and eighth electrodes 86 and 88 may extend through the sixth planar surface S6 in a pair to extend to the second planar surface S2. The seventh and eighth electrodes 86 and 88 may be formed on the second planar surface S2 to face each other.

The seventh and eighth electrodes 86 and 88 may be formed on the second and sixth planar surfaces S2 and S6 in at least two pairs. Before the protection layer 65 of FIG. 3 is formed on the first planar surface S1, the fifth through eighth electrodes 82, 84, 86, and 88 may be formed on the first, second, fifth, and sixth planar surfaces S1, S2, S5, and S6.

In this example embodiment, the fifth and sixth electrodes 82 and 84 may be formed on the first and second planar surfaces S1 and S2 to face the seventh and eighth electrodes 86 and 88. Second resistance pattern 105 may be formed at least between the fifth through eighth electrodes 82, 84, 86, and 88 in the Y and Z or second and third directions of the 3-dimensional space.

A first one of the second resistance patterns 105 may be formed on the fifth planar surface S5. The first one of the second resistance patterns 105 may be electrically connected to the fifth and sixth electrodes 82 and 84. In another embodiment, the first one of the second resistance patterns 105 may not be formed on the fifth planar surface S5 along with the fifth and sixth electrodes 82 and 84. A second one of the second resistance patterns 105 may be formed on the sixth planar surface S6. The second one of the second resistance patterns 105 may be electrically connected to the seventh and eighth electrodes 86 and 88.

The second one of the second resistance patterns 105 may not be formed on the sixth planar surface S6 along with the seventh and eighth electrodes 86 and 88. The second resistance patterns 105 may be formed parallel to or at an angle to the first resistance patterns 55(*a*) and 55(*b*). A distance between the first and second electrodes 32 and 34 or a distance between the third and fourth electrodes 36 and 38 may be equal to or different from a distance between the fifth and sixth electrodes 82 and 84 or a distance between the seventh and eighth electrodes 86 and 88.

Second protection layers 155 may be formed on the fifth and sixth planar surfaces S5 and S6 to cover the fifth through eighth electrodes 82, 84, 86, and 88 and the second resistance patterns 105. The second protection layers 155 may include the same material as the first protection layer 65. The first and second protection layers 65 and 155 may constitute a semiconductor resistance element 163 according to embodiments of the inventive concepts. The semiconductor resistance element 163 may also include the insulating substrate 15, the first through eighth electrodes 32, 34, 36, 38, 82, 84, 86, and 88, and the first and second resistance patterns 55 and 105.

According to another example embodiment, the fifth and sixth electrodes 82 and 84 may be fixed, placed or disposed in at least one pair on the fifth planar surface S5 at different levels and extend to at least one of the first and second planar surfaces S1 and S2. The seventh and eighth electrodes 86 and 88 may be fixed, placed or disposed in at least one pair on the sixth planar surface S6 at different levels and extend to at least one of the first and second planar surfaces S1 and S2. The second resistance pattern 105 may be electrically connected to the fifth through eighth electrodes 82, 84, 86, and 88 on the fifth and sixth planar surfaces S5 and S6 in a direction in which the fifth through eighth electrodes 82, 84, 86, and 88 are arranged.

Figure 5:
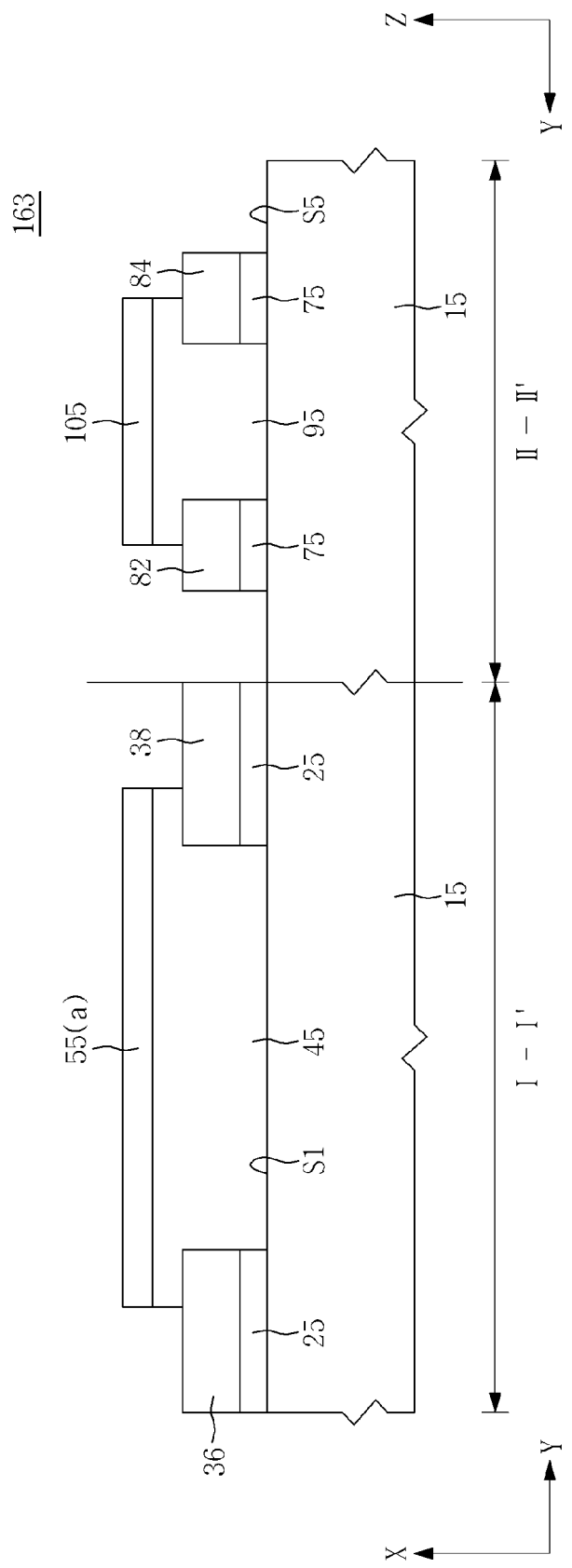

FIG. 5 is a cross-sectional view taken along lines I-P and II-IP of FIG. 4, which is a detailed view of the semiconductor resistance element of FIGS. 3 and 4.

Referring to FIG. 5, the semiconductor resistance element 163 according to embodiments of the inventive concepts may include third and fourth electrodes 36 and 38 fixed, placed or disposed on the insulating substrate 15. The third and fourth electrodes 36 and 38 may be disposed on the first planar surface S1 in X and Y or the first and the second directions of a 3-dimensional space. In an example embodiment, first adhesives 25 may be fixed, placed or disposed between the third and fourth electrodes 36 and 38 and the insulating substrate 15. The first adhesives 25 may be fixed, placed or disposed along the third and fourth electrodes 36 and 38 under the third and fourth electrodes 36 and 38.

In other example embodiments, the first adhesives 25 may not be fixed, placed or disposed between the third and fourth electrodes 36 and 38 and the insulating substrate 15. The first adhesives 25 may include an insulating material. The first resistance pattern 55(*a*) may be fixed, placed or disposed on the third and fourth electrodes 36 and 38 in the X and Y or the first and the second directions of the 3-dimensional space. The first resistance pattern 55(*a*) may overlap the third and fourth electrodes 36 and 38. In example embodiments, a second adhesive 45 may be fixed, placed or disposed between the insulating substrate 15, the third and fourth electrodes 36 and 38, and the first resistance pattern 55(a).

The second adhesive 45 may include a conductive material. Alternatively, the second adhesive 45 may not be disposed between the insulating substrate 15, the third and fourth electrodes 36 and 38, and the first resistance pattern 55(a). Thus, the first resistance pattern 55(a) may be fixed, placed or disposed on the third and fourth electrodes 36 and 38 to fill a concave between the insulating substrate 15 and the third and fourth electrodes 36 and 38. The first and second adhesives 25 and 45 may be fixed, placed or disposed adjacent to the first and second electrodes 32 and 34 of FIG. 4, and the first resistance pattern 55(b) of FIG. 4 that is electrically connected to the first and second electrodes 32 and 34, on the first planar surface S1 as described above.

The first protection layer 65 of FIG. 4 may be fixed, placed or disposed on the first planar surface 51 to cover the third and fourth electrodes 36 and 38 and the first resistance pattern 55(a). Fifth and sixth electrodes 82 and 84 may be fixed, placed or disposed on the fifth planar surface S5 of the insulating substrate 15 in Y and Z or the second and the third directions of the 3-dimensional space. In this example embodiment, third adhesives 75 may be fixed, placed or disposed between the fifth and sixth electrodes 82 and 84 and the insulating substrate 15. The third adhesives 75 may include the same material as or a different material from the first adhesives 25.

In other example embodiments, the third adhesives 75 may not be fixed, placed or disposed between the fifth and sixth electrodes 82 and 84 and the insulating substrate 15. The second resistance pattern 105 may be fixed, placed or disposed on the fifth and sixth electrodes 82 and 84 in the Y and Z or the second and third directions of the 3-dimensional space. In this example embodiment, a fourth adhesive 95 may be fixed, placed or disposed between the insulating substrate 15, the fifth and sixth electrodes 82 and 84 and the second resistance pattern 105. The fourth adhesive 95 may include the same material as or a different material from the second adhesive 45.

The third and fourth adhesives 75 and 95 may be fixed, placed or disposed adjacent to the seventh and eighth electrodes 86 and 88 of FIG. 4, and the another resistance pattern 105 of FIG. 4 which is electrically connected to the seventh and eighth electrodes 86 and 88, on the sixth planar surface S6 as described above. The second protection layer 155 of FIG. 4 may be disposed on the fifth planar surface S5 to cover the fifth and sixth electrodes 82 and 84 and the second resistance pattern 105.

Figure 6:
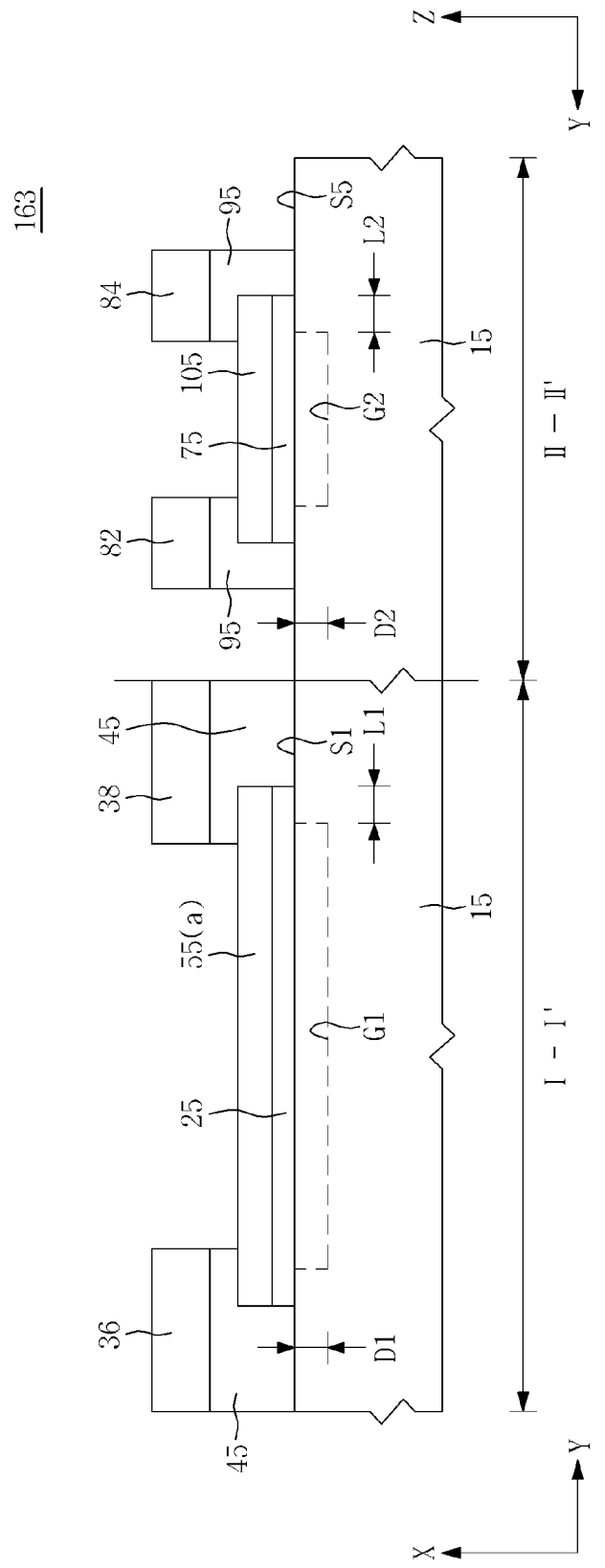

FIG. 6 is a cross-sectional view taken along lines I-I' and II-II' of FIG. 4, which is a detailed view of a semiconductor resistance element of FIGS. 3 and 4, according to another example embodiment of the inventive concepts than in FIG. 5. FIG. 6 uses like reference numerals for like members as shown in FIG. 5.

Referring to FIG. 6, the semiconductor resistance element 163 according to embodiments of the inventive concepts may include the first resistance pattern 55(a) fixed, placed or disposed on or in the first planar surface S1 of the insulating substrate 15. The insulating substrate 15 may or may not have a first groove G1 fixed, placed or disposed in the first planar surface S1 in X and Y or the first and the second directions of a 3-dimensional space. The first groove G1 may extend from the first planar surface S1 towards a lower portion of the insulating substrate 15.

When the first groove G1 is not formed in the first planar surface S1, a first adhesive 25 may be fixed, placed or disposed between the insulating substrate 15 and the first resistance pattern 55(a). When the first groove G1 is formed in the first planar surface S1, the first resistance pattern 55(a) may fill the first groove G1 and protrude from the first groove G1 or the first planar surface S1. The first groove G1 may have a required, preferred or predetermined depth D1. The first resistance pattern 55(a) may extend by a required, preferred or predetermined depth L1 from the first groove G1 along the first planar surface S1.

The first resistance pattern 55(a) may be fixed, placed or disposed only in the first groove G1. The first adhesive 25 may be fixed, placed or disposed between the insulating substrate 15 and the first resistance pattern 55(a) to conformally cover the first groove G1. The first adhesive 25 may not be fixed, placed or disposed on the first groove G1 and/or adjacent to the first groove G1. Third and fourth electrodes 36 and 38 may overlap the first resistance pattern 55(a). In this example embodiment, second adhesives 45 may be fixed, placed or disposed between the insulating substrate 15, the third and fourth electrodes 36 and 38, and the first resistance pattern 55(a).

The second adhesives 45 may not be disposed between the insulating substrate 15, the third and fourth electrodes 36 and 38, and the first resistance pattern 55(a). The first groove G1 and the first and second adhesives 25 and 45 may be fixed, placed or disposed adjacent to the first and second electrodes 32 and 34 of FIG. 4, and the first resistance pattern 55(b) of FIG. 4 which is electrically connected to the first and second electrodes 32 and 34, on the first planar surface S1 as described above. A first protection layer 65 of FIG. 4 may be disposed on the first planar surface S1 to cover the third and fourth electrodes 36 and 38 and the first resistance pattern 55(a).

The semiconductor resistance element 163 according to embodiments of the inventive concepts may include the second resistance pattern 105 fixed, placed or disposed on or in the fifth planar surface S5 of the insulating substrate 15. The insulating substrate 15 may or may not include a second groove G2 disposed in the fifth planar surface S5 in the Y and Z or the second and third directions of the 3-dimensional space. The second groove G2 may extend from the fifth planar surface S5 toward a central region of the insulating substrate 15. When the second groove G2 is not formed in the fifth planar surface S5, a third adhesive 75 may be fixed, placed or disposed between the insulating substrate 15 and the first resistance pattern 105.

If the second groove G2 is disposed in the fifth planar surface S5, the second resistance pattern 105 may fill the second groove G2 and protrude from the second groove G2 or the fifth planar surface S5. The second groove G2 may have a required, desired or predetermined depth D2. The second resistance pattern 105 may extend by a required, desired or predetermined depth L2 from the second groove G2 along the fifth planar surface S5. The second resistance pattern 105 may be fixed, placed or disposed only in the second groove G2. The third adhesive 75 may be fixed, placed or disposed between the insulating substrate 15 and the second resistance pattern 105 to conformally cover the second groove G2.

The third adhesive 75 may not be fixed, placed or disposed on the second groove G2 and/or adjacent to the second groove G2. Fifth and sixth electrodes 82 and 84 may be disposed in the Y and Z or the second and the third directions of the 3-dimensional space to overlap the second resistance pattern 105. In this example embodiment, fourth adhesives 95 may be fixed, placed or disposed between the insulating substrate 15, the fifth and sixth electrodes 82 and 84, and the first resistance pattern 55(a). The fourth adhesives 95 may not be disposed between the insulating substrate 15, the fifth and sixth electrodes 82 and 84, and the second resistance pattern 105.

The second groove G2 and the third and fourth adhesives 75 and 95 may be disposed adjacent to the seventh and eighth electrodes 86 and 88 of FIG. 4, and the second resistance pattern 105 of FIG. 4 which is electrically connected to the seventh and eighth electrodes 86 and 88 on the sixth planar surface S6 as described above. A second protection layer 155 of FIG. 4 may be disposed on the fifth planar surface S5 to cover the fifth and sixth electrodes 82 and 84 and the second resistance pattern 105.

Figure 7:
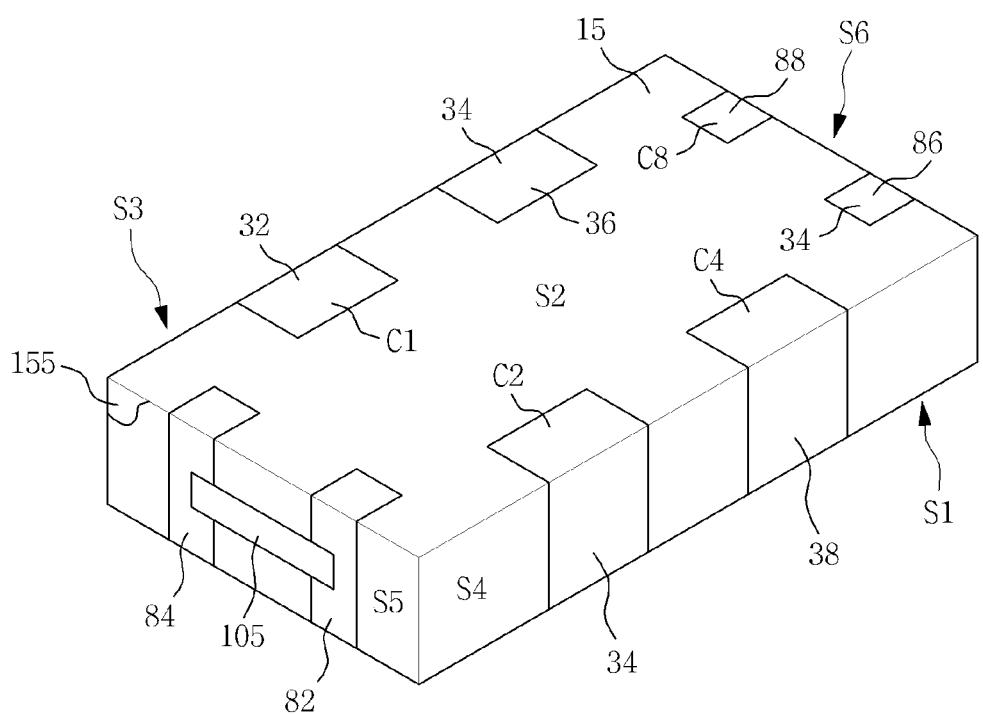
Figure 7:
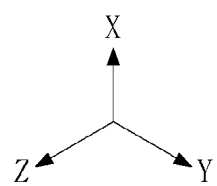

FIG. 7 is a perspective view of the semiconductor resistance element in which first and second planar surfaces of an insulating substrate of FIG. 4 are disposed in reverse order in the X or the first direction of the 3-dimensional space.

Referring to FIG. 7, a semiconductor resistance element 163 according to embodiments of the inventive concepts may include connection terminals C1, C2, C3, C4, C5, C6, C7, and C8 that may be fixed, placed or disposed on the second planar surface S2. The connection terminals C1, C2, C3, C4, C5, C6, C7, and C8 may include a first end of first through eighth electrodes 32, 34, 36, 38, 82, 84, 86, and 88. A second end of the first through fourth electrodes 32, 34, 36, and 38 may be electrically connected to first resistance patterns 55($a$) and 55($b$) on the first planar surface S1 in FIG. 4. The second end of the fifth through eighth electrodes 82, 84, 86, and 88 may be disposed on or adjacent to the first planar surface S1 in FIG. 4.

The connection terminals C1, C2, C3, C4, C5, C6, C7, and C8 may contact electric pads B1, B2, B3, B4, B5, B6, B7, and B8, respectively, on the module substrate 173 of FIG. 2. Alternatively, the connection terminals C1, C2, C3, C4, C5, C6, C7, and C8 may be electrically connected to the electric pads B1, B2, B3, B4, B5, B6, B7, and B8 by adhesives including a conductive material.

Figure 8:
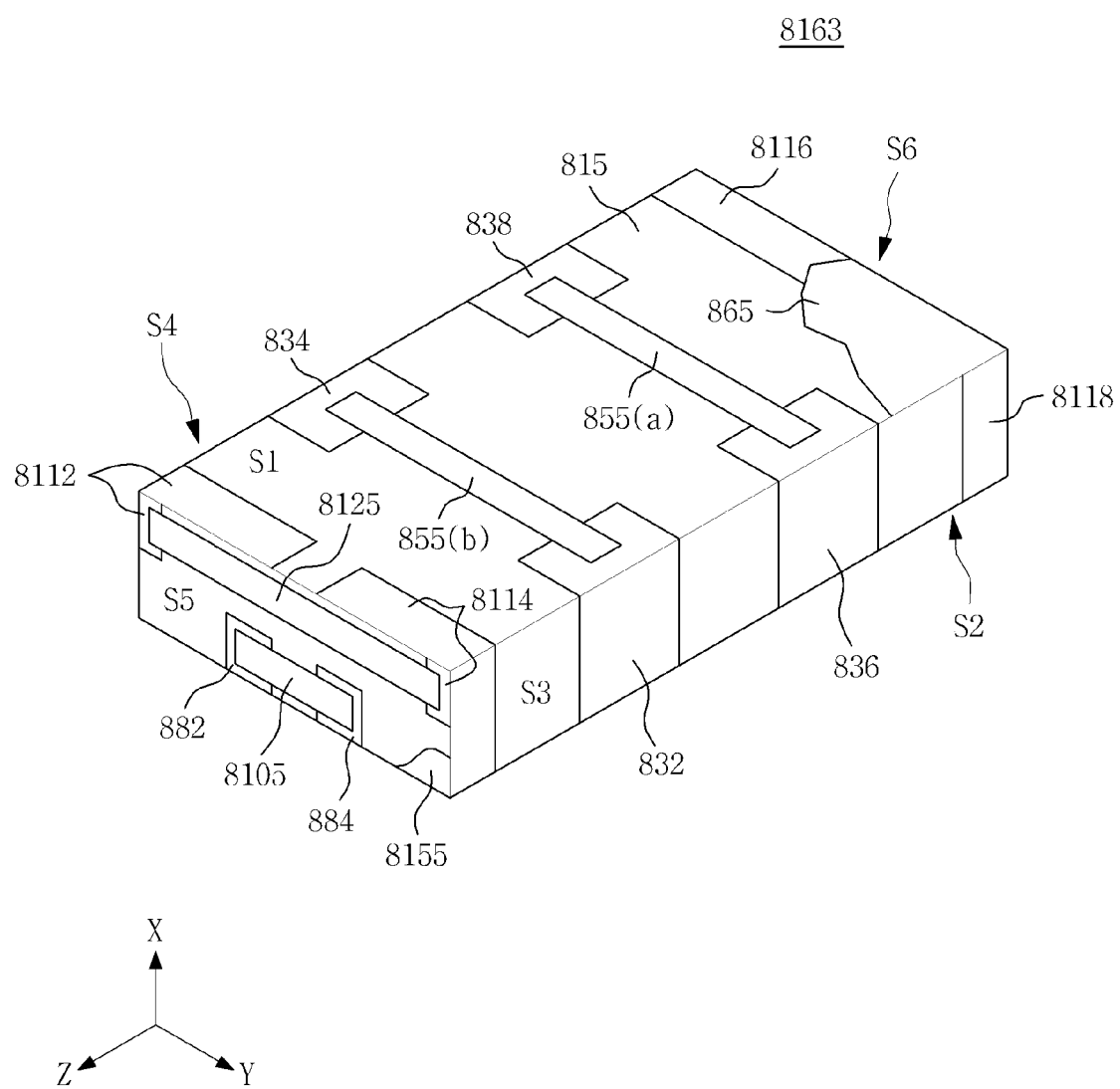
FIGS. 8 and 9 are schematic views illustrating a method of forming a semiconductor resistance element of FIG. 1, according to embodiments of the inventive concepts.
Figure 9:
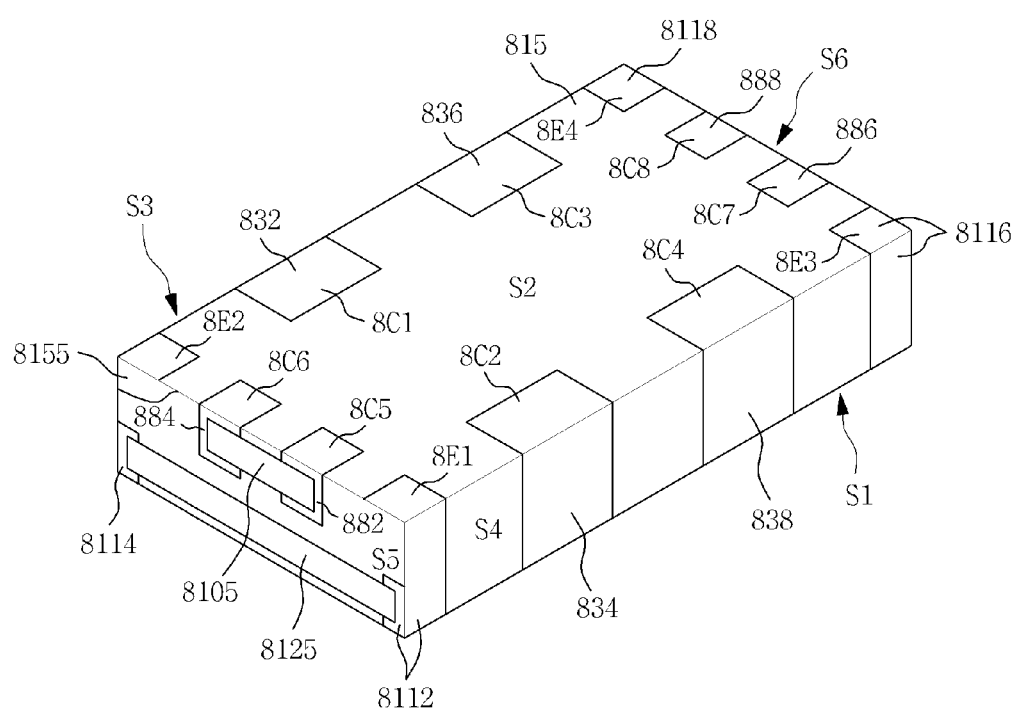

FIGS. 8 and 9 are schematic views illustrating a method of forming a semiconductor resistance element of FIG. 1.

FIG. 8 is a perspective view of the semiconductor resistance element in which first and second planar surfaces of an insulating substrate of FIG. 4 are disposed in a regular order in the X or the first direction of the 3-dimensional space.

Referring to FIG. 8, according to embodiments of the inventive concepts, first through fourth electrodes 832, 834, 836, and 838, first resistance patterns 855($a$) and 855($b$), and a first protection layer 865 may be formed on an insulating substrate 15. Fifth and sixth electrodes 882 and 884 may be formed in a pair on one region of the fifth planar surface S5 of the insulating substrate 815 in X and Z or first and third directions of the 3-dimensional space. The fifth and sixth electrodes 882 and 884 may extended into the fifth planar surface S5 to extend to the second planar surface S2. The fifth and sixth electrodes 882 and 884 may be formed in at least two pairs on the one region of a fifth planar surface S5.

Seventh and eighth electrodes (not shown) may be formed in a pair on one region of a sixth planar surface S6 of the insulating substrate 815 in the X and Z or first and third directions of the 3-dimensional space. The seventh and eighth electrodes 886 and 888 may extend into the sixth planar surface S6 to extend to the second planar surface S2. The seventh and eighth electrodes 886 and 888 may be formed in at least two pairs on the one region of the sixth planar surface S6. Ninth and tenth electrodes 8112 and 8114 may be formed in a pair on the other region of the fifth planar surface S5 in the X, Y and Z or the first, second and third directions of the 3-dimensional space.

The ninth and tenth electrodes 8112 and 8114 may extend into the first, third, fourth, and fifth planar surfaces S1, S3, S4, and S5 to extend to the second planar surface S2. The ninth and tenth electrodes 8112 and 8114 may extend into the fifth planar surface S5 to directly or substantially extend toward the second planar surface S2. The ninth and tenth electrodes 8112 and 8114 may be formed in at least two pairs on the second and fifth planar surfaces S2 and S5. Eleventh and twelfth electrodes 8116 and 8118 may be formed in a pair on the other region of the sixth planar surface S6 in the X, Y and Z or the first, second and third directions of the 3-dimensional space.

The eleventh and twelfth electrodes 8116 and 8118 may extend into the first, third, fourth, and sixth planar surfaces S1, S3, S4, and S6 to extend to the second planar surface S2. The eleventh and twelfth electrodes 8116 and 8118 may have the same shape as the ninth and tenth electrodes 8112 and 8114 on the sixth planar surface S6. The eleventh and twelfth electrodes 8116 and 8118 may cross the sixth planar surface S6 to directly or substantially extend toward the second planar surface S2. The eleventh and twelfth electrodes 8116 and 8118 may be formed in at least two pairs on the second and sixth planar surfaces S2 and S6.

A distance between the first and second electrodes 832 and 834 or a distance between the third and fourth electrodes 836 and 838 may be equal to or different from a distance between the fifth and sixth electrodes 882 and 884 or a distance between the seventh and eighth electrodes 886 and 888. A distance between the ninth and tenth electrodes 8112 and 8114 may be equal to or different from the distance between the fifth and sixth electrodes 882 and 884 on the fifth planar surface S5. A distance between the eleventh and twelfth electrodes 8116 and 8118 may be equal to or different from the distance between the seventh and eighth electrodes 886 and 888 on the sixth planar surface S6.

A plurality of second resistance patterns 8105 may be formed between the fifth and sixth electrodes 882 and 884 and between the seventh and eighth electrodes 886 and 888. A plurality of third resistance patterns 8125 may be formed between the ninth and tenth electrodes 8112 and 8114 and between the eleventh and twelfth electrodes 8116 and 8118. The plurality of third resistance patterns 8125 may include the same material as or a different material from the plurality of second resistance patterns 8105. A plurality of second protection layers 8155 may be formed on the fifth and sixth planar surfaces S5 and S6.

A first of the plurality the second protection layers 8155 may cover the fifth, sixth, ninth, and tenth electrodes 882, 884, 8112, and 8114 and the second and third resistance patterns 8105 and 8125 on the fifth planar surface S5. A second of the plurality of second protection layers 8155 may cover the seventh, eighth, eleventh, and twelfth electrodes 886, 888, 8116, and 8118 and the second and third resistance patterns 8105 and 8125 on the sixth planar surface S6. In another example embodiment, the seventh and eighth electrodes 886 and 888, the eleventh and twelfth electrodes 8116 and 8118, the second and third resistance patterns 8105 and 8125, and the second protection layer 8155 may not be formed on the sixth planar surface S6.

Thus, the first through third resistance patterns 855($a$), 855($b$), 8105, and 8125 may constitute a semiconductor resistance element 8163 according to embodiments of the inventive concepts along with the first through twelfth electrodes 832, 834, 836, 838, 882, 884, 886, 888, 8112, 8114, 8116, and 8118 and the first and second protection layers 865 and 8155. From a cross-sectional view, the semiconductor resistance element 8163 may have the shape of FIG. 5 or 6.

FIG. 9 is a perspective view of a semiconductor resistance element in which first and second planar surfaces of an insulating substrate of FIG. 8 are disposed in reverse order in the X or the first direction of the 3-dimensional space.

Referring to FIG. 9, a semiconductor resistance element 8163 according to embodiments of the inventive concepts may include connection terminals 8C1, 8C2, 8C3, 8C4, 8C5, 8C6, 8C7, 8C8, 8E1, 8E2, 8E3, and 8E4 disposed on the second planar surface 8S2. The connection terminals 8C1, 8C2, 8C3, 8C4, 8C5, 8C6, 8C7, 8C8, 8E1, 8E2, 8E3, and 8E4 may be one of the ends of the first through twelfth electrodes 832, 834, 836, 838, 882, 884, 886, 888, 8112, 8114, 8116, and 8118. The other end of the first through fourth electrodes 832, 834, 836, and 838 may be electrically connected to the first resistance patterns 855(a) and 855(b) on the first planar surface S1 in FIG. 8.

The other ends of the fifth through eighth electrodes 882, 884, 886, and 888 may be placed, fixed or disposed on or adjacent to the first planar surface S1 in FIG. 8. The other ends of the ninth through twelfth electrodes 8112, 8114, 8116, and 8118 may be fixed, placed or disposed on or adjacent to the first planar surface S1 in FIG. 8. In this example embodiment, the module substrate 173 of FIG. 2 may have electric pads in equal number to the connection terminals 8C1, 8C2, 8C3, 8C4, 8C5, 8C6, 8C7, 8C8, 8E1, 8E2, 8E3, and 8E4.

Figure 10:
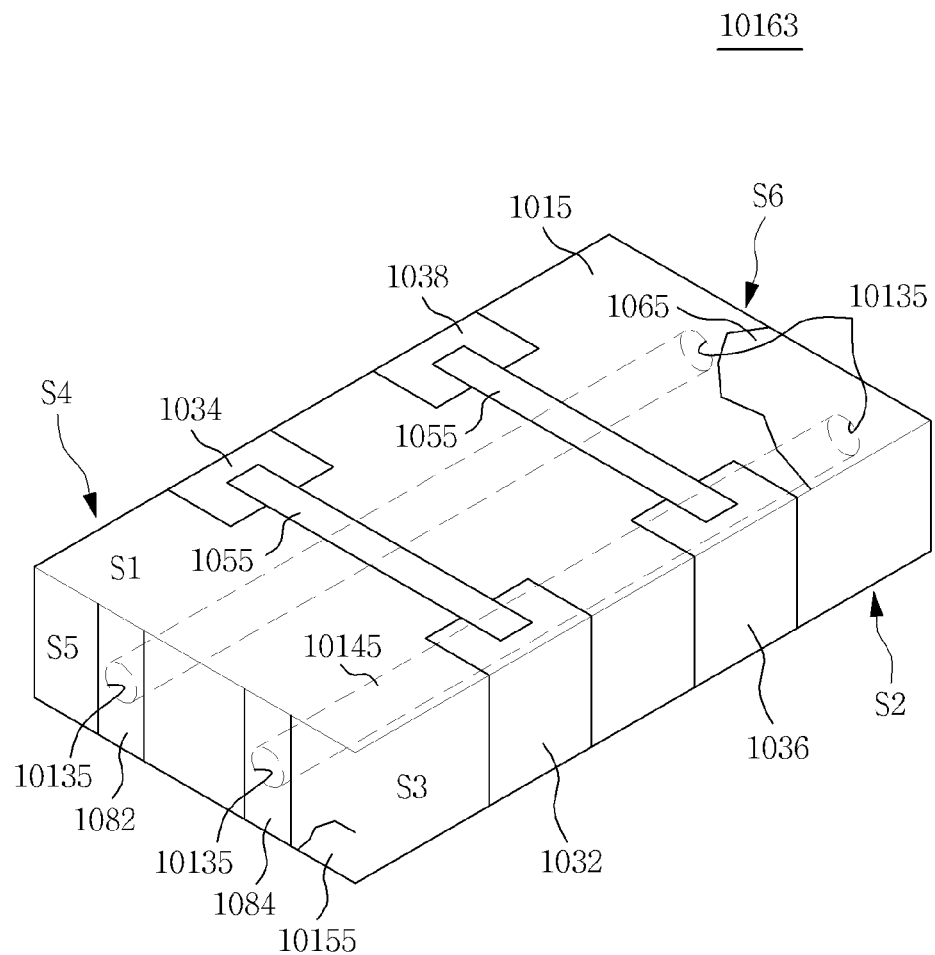
FIGS. 10 and 11 are schematic views illustrating a method of forming a semiconductor resistance element of FIG. 1, according to embodiments of the inventive concepts.
Figure 11:
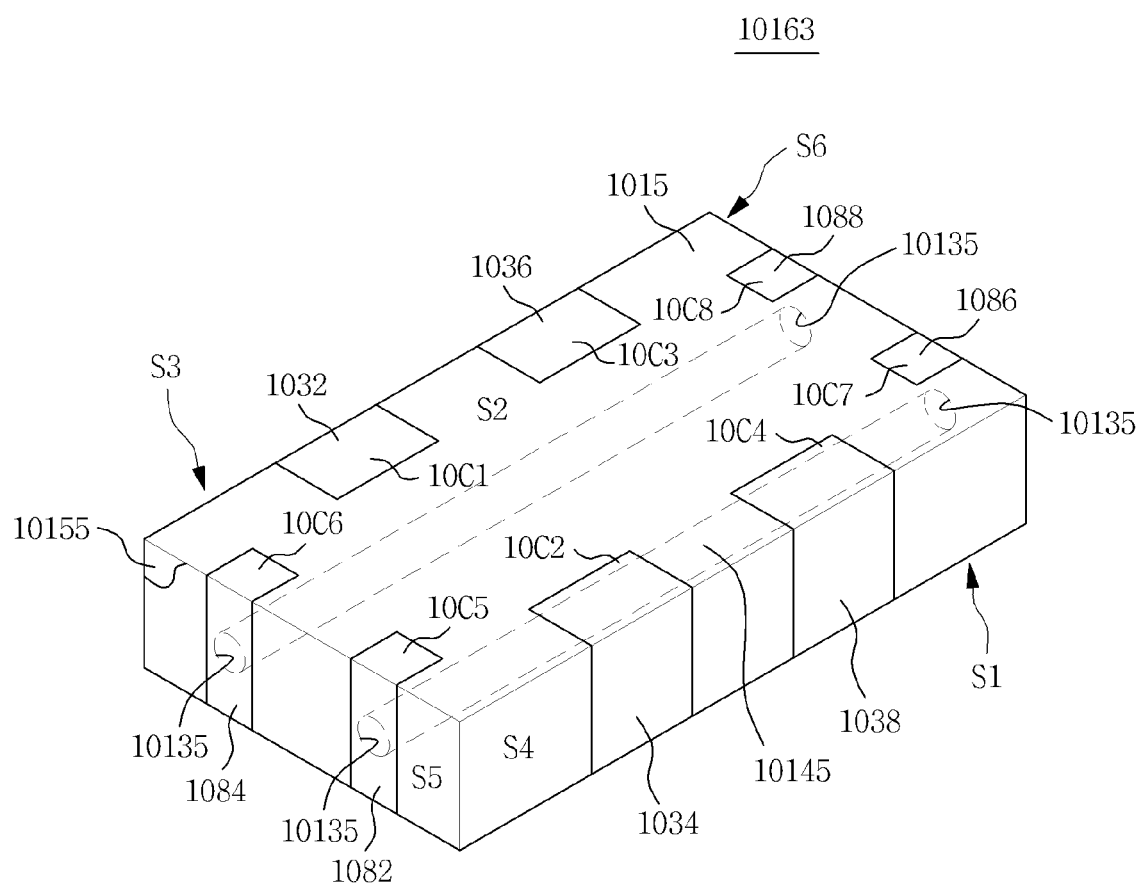

FIGS. 10 and 11 are schematic views illustrating a method of forming a semiconductor resistance element of FIG. 1.

FIG. 10 is a perspective view of a semiconductor resistance element in which first and second planar surfaces of an insulating substrate fixed, placed or disposed in a regular order in an X or a first direction of a 3-dimensional space.

Referring to FIG. 10, according to embodiments of the inventive concepts, first through fourth electrodes 1032, 1034, 1036, and 1038, first resistance patterns 1055, and a first protection layer 1065 may be formed on the insulating substrate 1015. Through holes 10135 may be formed in the insulating substrate 1015 in a Z or a third direction of the 3-dimensional space. The through holes 10135 may be formed in a pair through the insulating substrate 1015 between the fifth and sixth planar surfaces S5 and S6 of the insulating substrate 1015. Each of the through holes 10135 may be formed in at least each of different level in the fifth and sixth planar surfaces S5 and S6.

In other embodiments, the through holes 10135 may be formed in at least two pairs in one region of each of the fifth and sixth planar surfaces S5 and S6 along the insulating substrate 1015. The through holes 10135 may be formed in at least two pairs in other regions of each of the fifth and sixth planar surfaces S5 and S6 along the insulating substrate 1015. In this example embodiment, before the through holes 10135 are formed, the insulating substrate 1015 may be partitioned or separated into a plurality of pieces in the Y or the second direction of the 3-dimensional space between the first resistance patterns 1055. The through holes 10135 may be formed in the plurality of partitions or pieces in the Z or the third direction of the 3-dimensional space.

The plurality of partitioned or pieces of substrate may contact to one another to form the insulating substrate 1015. In other example embodiments, only one of the through holes 10135 may be formed in the insulating substrate 1015. Second resistance patterns 10145 may be formed in the through holes 10135. The second resistance patterns 10145 may sufficiently fill the through holes 10135 and be exposed from the fifth and sixth planar surfaces S5 and S6. The second resistance patterns 10145 may include the same material as or a different material from the second resistance patterns 105 of FIG. 4.

Fifth through eighth electrodes 1082, 1084, 1086, and 1088 (1086 and 1088 are not shown) may be formed on the fifth and sixth planar surfaces S5 and S6 to cover the second resistance patterns 10145. The fifth through eighth electrodes 1082, 1084, 1086, and 1088 may extend across the fifth and sixth planar surfaces S5 and S6 to extend to the second planar surface S2. The fifth through eighth electrodes 1082, 1084, 1086, and 1088 may extend across the fifth and sixth planar surfaces S5 and S6 to extend to the first and second planar surfaces S1 and S2. A distance between the first and second electrodes 1032 and 1034 or a distance between the third and fourth electrodes 1036 and 1038 may be equal to or different from a distance between the fifth and sixth electrodes 1082 and 1084 or a distance between the seventh and eighth electrodes 1086 and 1088.

Second protection layers 10155 may be formed on the fifth and sixth planar surfaces S5 and S6 to cover the fifth through eighth electrodes 1082, 1084, 1086, and 1088. Thus, the first and second protection layers 1065 and 10155 may constitute a semiconductor resistance element 10163 according to embodiments of the inventive concepts along the insulating substrate 1015, the first through eighth electrodes 1032, 1034, 1036, 1038, 1082, 1084, 1086, and 1088, and the first and second resistance patterns 1055 and 10145. From a cross-sectional view, the semiconductor resistance element 10163 may have the shape shown in FIG. 5 or 6 except for the second resistance patterns 10145.

In this example embodiment, the semiconductor resistance element 10163 may have an adhesive including a conductive material between the fifth through eighth electrodes 1082, 1084, 1086, and 1088 and the second resistance patterns 10145.

FIG. 11 is a perspective view of a semiconductor resistance element in which first and second planar surfaces S1 and S2 of an insulating substrate 1015 of FIG. 10 are disposed in reverse order in the X or the first direction of the 3-dimensional space, unlike FIG. 4.

Referring to FIG. 11, a semiconductor resistance pattern 10163 according to embodiments of the inventive concepts may include connection terminals 10C1, 10C2, 10C3, 10C4, 10C5, 10C6, 10C7, and 10C8 disposed on the second planar surface 10S2. The connection terminals 10C1, 10C2, 10C3, 10C4, 10C5, 10C6, 10C7, and 10C8 may be one of the ends of the first through eighth electrodes 1032, 1034, 1036, 1038, 1082, 1084, 1086, and 1088. Another end of the first through fourth electrodes 1032, 1034, 1036, and 1038 may be electrically connected to the first resistance patterns 1055 on the first planar surface S1 in FIG. 10.

Another end of the fifth through eighth electrodes 1082, 1084, 1086, and 1088 may be disposed on or adjacent to the first planar surface S1 in FIG. 10. The connection terminals 10C1, 10C2, 10C3, 10C4, 10C5, 10C6, 10C7, and 10C8 may contact the electric pads B1, B2, B3, B4, B5, B6, B7, and B8, respectively, on a module substrate of FIG. 2. In another example embodiment, the connection terminals 10C1, 10C2, 10C3, 10C4, 10C5, 10C6, 10C7, and 10C8 may be electrically connected to the electric pads B1, B2, B3, B4, B5, B6, B7, and B8 by adhesives including a conductive material.

Figure 12:
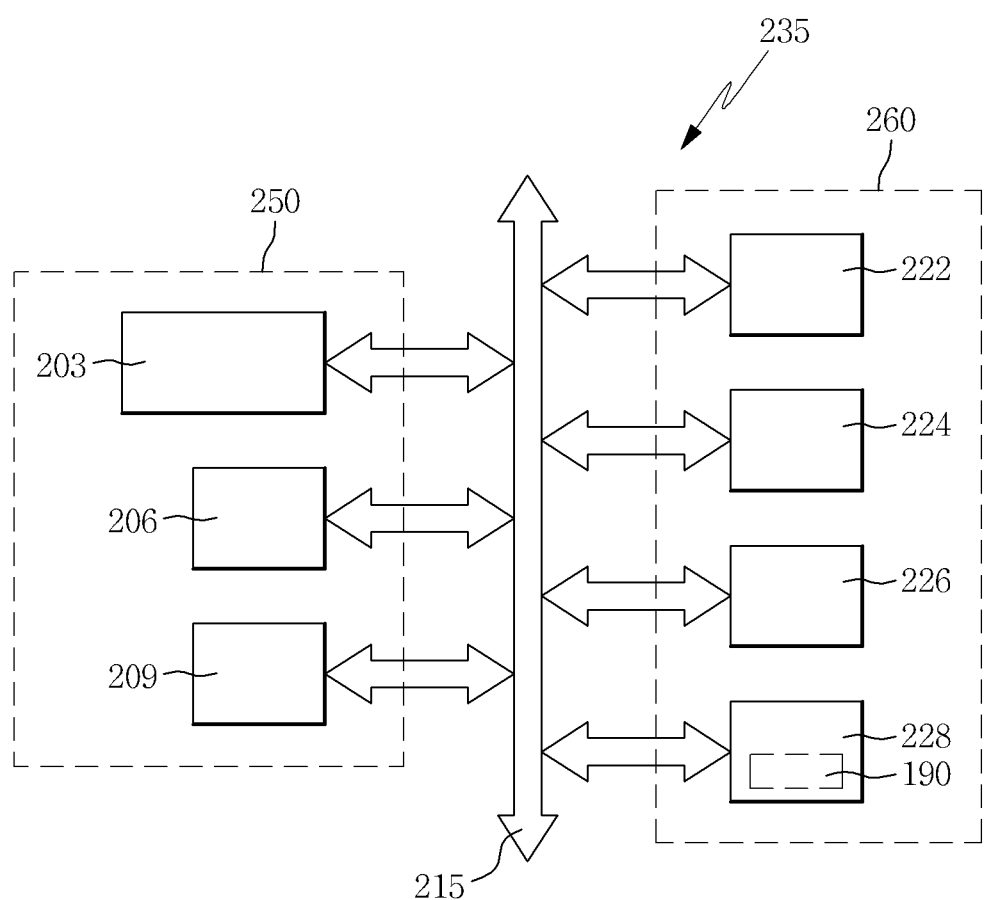
FIG. 12 is a plan view of a processor-based system including a semiconductor module of FIG. 1.

FIG. 12 is a plan view of a processor-based system including a semiconductor module of FIG. 1.

Referring to FIG. 12, a processor-based system 235 according to embodiments of the inventive concepts may include at least one system board (not shown). The at least one system board may include at least one bus line 215. A first module unit 250 may be disposed on the at least one bus line 215. The first module unit 250 may be electrically connected to the at least one bus line 215.

The first module unit 250 may include a central processing unit (CPU) 203, a floppy disk drive (FDD) 206, and a compact disk read-only-memory (ROM) drive 209. Also, a second module unit 260 may be disposed on the at least one bus line 215. A second module unit 260 may be electrically connected to the at least one bus line 215.

The second module unit 260 may include first input/output (I/O) device 222, a second I/O device 224, a ROM 226, and a random access memory (RAM) 228. The RAM 228 may include the semiconductor module 190 of FIG. 1, according to embodiments of the inventive concepts. The semiconductor module 190 may include at least one of the semiconductor resistance elements 163, 8163, and 10163 of FIGS. 4, 8, and 10.

In another example embodiment, the processor-based system 235 may include first and second module units 250 and 260, which include at least one of the semiconductor resistance elements 163, 8163, and 10163 of FIGS. 4, 8, and 10. Thus, the processor-based system 235 may include the at least one of the semiconductor resistance elements 163, 8163, and 10163 according to embodiments of the inventive concepts so that the processor-based system 235 may have better or improved electrical properties than in the conventional art. The processor-based system 235 may include a computer system, a process control system, or another system.

As described above, embodiments of the inventive concepts may provide a semiconductor resistance element wherein resistance patterns are arranged on an insulating substrate with a process margin. The resistance patterns may be disposed on planar surfaces defining the insulating substrate and making at a right angle with one another. In other example embodiments, the resistance patterns may be disposed on selected planar surfaces of the semiconductor resistance element, which are disposed alternatively with respect to one another on the insulating substrate.

As a result, the semiconductor resistance element may have the resistance patterns, which are less likely to be electrically connected to one another than in the conventional art with a high integration density of a semiconductor module. Thus, the semiconductor module may include the semiconductor resistance element to provide an electrical resistance lower than in the conventional art.

Furthermore, a processor-based system may include the semiconductor module to improve electrical properties thereof.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of these embodiments of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor resistance element comprising:
   a substrate configured to form a solid body, and the substrate having first and second planar surfaces disposed in a first direction, third and fourth planar surfaces at least between the first and second planar surfaces in a second direction, and fifth and sixth planar surfaces at least between the first and second planar surfaces in a third direction;
   a first resistance pattern configured to cover a selected one of the first and second planar surfaces; and
   a second resistance pattern on at least one of the third through sixth planar surfaces.

2. The semiconductor resistance element of claim 1, further comprising:
   a first electrode electrically connected to a first end of the first resistance pattern;
   a second electrode electrically connected to a second end of the first resistance pattern;
   a third electrode electrically connected to a first end of the second resistance pattern; and
   a fourth electrode electrically connected to a second end of the second resistance pattern.

3. The semiconductor resistance element of claim 2, wherein the first and second electrodes extend across the third and fourth planar surfaces respectively and extend to the first and second planar surfaces, and the first resistance pattern is on the selected one of the first and second planar surfaces.

4. The semiconductor resistance element of claim 3, wherein the third and fourth electrodes extend across at least one of the fifth and sixth planar surfaces and the third and fourth electrodes extend to at least one of the first and second planar surfaces, and the second resistance pattern is on the at least one of the fifth and sixth planar surfaces.

5. The semiconductor resistance element of claim 4, wherein the second resistance pattern is disposed parallel to or at an angle to the first resistance pattern.

6. A semiconductor module comprising:
   a module substrate; and
   a first semiconductor resistance element on the module substrate and electrically connected to the module substrate, the first semiconductor resistance element including;
   a substrate defined by first through sixth planar surfaces, and having the first and second planar surfaces at different levels, the third and fourth planar surfaces at least between the first and second planar surfaces in a first direction, and the fifth and sixth planar surfaces at least between the first and second planar surfaces in a second direction,
   a first resistance pattern configured to partially cover a selected one of the first and second planar surfaces, and
   a second resistance pattern on at least one of the third through sixth planar surfaces.

7. The semiconductor module of claim 6, further comprising:
   a first electrode electrically connected to a first end of the first resistance pattern;
   a second electrode electrically connected to a second end of the first resistance pattern;
   a third electrode electrically connected to a first end of the second resistance pattern; and
   a fourth electrode electrically connected to a second end of the second resistance Pattern;
   wherein the second resistance pattern is parallel to or at an angle to the first resistance pattern.

8. The semiconductor module of claim 7, wherein the first and second electrodes extend across the third and fourth planar surfaces respectively and extend to the first and second planar surfaces, and the first resistance pattern is on the selected one of the first and second planar surfaces, and the third and fourth electrodes extending across at least one of the fifth and sixth planar surfaces in a pair and extend to at least one of the first and second planar surfaces, and the second resistance pattern is on the at least one of the fifth and sixth planar surfaces.

9. The semiconductor module of claim 7, wherein the first and second electrodes extend across the third and fourth planar surfaces respectively and extend to the first and second planar surfaces, and the first resistance pattern is on the selected one of the first and second planar surfaces, and the third and fourth electrodes are in at least one pair at each of different levels on at least one of the fifth and sixth planar surfaces and extend to at least one of the first and second planar surfaces, and the second resistance pattern is on the at least one of the fifth and sixth planar surfaces.

10. The semiconductor module of claim 7, wherein the first and second electrodes extend across the third and fourth planar surfaces respectively and extend to the first and second planar surfaces, and the first resistance pattern fills a first groove in the selected one of the first and second planar surfaces and the first resistance pattern protrudes from the first groove, and the third and fourth electrodes extend across at least one of the fifth and sixth planar surfaces in a pair and extend to at least one of the first and second planar surfaces, and the second resistance pattern fills a second groove in the at least one of the fifth and sixth planar surfaces and the second resistance pattern protrudes from the second groove.

11. The semiconductor module of claim 7, wherein the first and second electrodes extend across the third and fourth planar surfaces respectively and extend to the first and second planar surfaces, and the first resistance pattern fills a first groove in the selected one of the first and second planar surfaces and the first resistance pattern protrudes from the first groove, and the third and fourth electrodes are in at least one pair at each of different levels on at least one of the fifth and sixth planar surfaces and extend to at least one of the first and second planar surfaces, and the second resistance pattern fills a second groove in the at least one of the fifth and sixth planar surfaces and the second resistance pattern protrudes from the second groove.

12. The semiconductor module of claim 7, wherein the first and second electrodes extend across the third and fourth planar surfaces respectively and extend to the first and second planar surfaces, and the first resistance pattern is on the selected one of the first and second planar surfaces, and the third and fourth electrodes extend across the fifth and sixth planar surfaces respectively and extend to at least one of the first and second planar surfaces, and the second resistance pattern contacts the third and fourth electrodes through the substrate defined by the fifth and sixth planar surfaces.

13. The semiconductor module of claim 7, wherein the first and second electrodes extend across the third and fourth planar surfaces respectively and extend to the first and second planar surfaces, and the first resistance pattern is on the selected one of the first and second planar surfaces, and Each of the third and fourth electrodes is disposed at least one at different levels on each of the fifth and sixth planar surfaces, and extend to at least one of the first and second planar surfaces, and the second resistance pattern contacts the third and fourth electrodes through the substrate between the fifth and sixth planar surfaces.

14. The semiconductor module of claim 7, further comprising:

a third resistance pattern adjacent to the second resistance pattern;

a fifth electrode electrically connected to a first end of the third resistance pattern; and a sixth electrode electrically connected to a second end of the third resistance pattern; and wherein the first and second electrodes extend across the third and fourth planar surfaces respectively and extend to the first and second planar surfaces, the first resistance pattern is on the selected one of the first and second planar surfaces, and the third and fourth electrodes cover a first region of at least one of the fifth and sixth planar surfaces in a first pair and the third and fourth electrodes extend to at least one of the first and second planar surfaces, and the second resistance pattern is on the first region of the at least one of the fifth and sixth planar surfaces, the fifth and sixth electrodes cover a second region of the at least one of the fifth and sixth planar surfaces in a second pair and the fifth and sixth electrodes extend to the at least one of the first and second planar surfaces, and the third resistance pattern is on the second region of the at least one of the fifth and sixth planar surfaces.

15. The semiconductor module of claim 14, wherein a distance between the first and second electrodes is equal to or different from a distance between the third and fourth electrodes, a distance between the third and fourth electrodes is different from a distance between the fifth and sixth electrodes, and the second resistance pattern is disposed parallel to or at an angle to the third resistance pattern.

* * * * *